United States Patent [19]

Eichrodt et al.

[11] 4,323,982
[45] Apr. 6, 1982

[54] LOGIC CIRCUIT ARRANGEMENT IN THE INTEGRATED MOS-CIRCUITRY TECHNIQUE

[75] Inventors: Dieter Eichrodt; Friedhelm Elsen, both of Munich, Fed. Rep. of Germany

[73] Assignee: Siemens Aktiengesellschaft, Berlin and Munich, Fed. Rep. of Germany

[21] Appl. No.: 94,931

[22] Filed: Nov. 16, 1979

Related U.S. Application Data

[63] Continuation of Ser. No. 841,798, Oct. 13, 1977, abandoned.

[30] Foreign Application Priority Data

Oct. 22, 1976 [DE] Fed. Rep. of Germany ....... 2647982

[51] Int. Cl.³ .......................... G06F 7/50; G06F 7/38
[52] U.S. Cl. .................. 364/786; 340/146.2
[58] Field of Search .................... 364/786; 340/146.2; 235/92 GT

[56] References Cited

U.S. PATENT DOCUMENTS

| | | | |
|---|---|---|---|
| 3,767,906 | 10/1973 | Pryor | 364/786 |
| 3,843,876 | 10/1974 | Fette et al. | 364/786 |
| 4,012,714 | 3/1977 | Lohmann | 340/146.2 |
| 4,037,085 | 7/1977 | Minorikawa | 235/92 GT X |

Primary Examiner—David H. Malzahn
Attorney, Agent, or Firm—Hill, Van Santen, Steadman, Chiara & Simpson

[57] ABSTRACT

A multi-stage logic circuit employing integrated MOS-circuit techniques having gates to produce carry signals between stages where the gates which transfer the carry signals are designed as transfer-gates. Specific circuits are shown for full adders, comparators, synchronous binary counters, forwards-backwards synchronous binary counters and forwards-synchronous counting decades.

2 Claims, 5 Drawing Figures

LOGIC CIRCUIT ARRANGEMENT IN THE INTEGRATED MOS-CIRCUITRY TECHNIQUE

This is a continuation of application Ser. No. 841,798, filed Oct. 13, 1977, now abandoned.

BACKGROUND OF THE INVENTION

1. Description of the Prior Art

A known design of logic-linking circuits using integrated MOS-techniques for binary signal transmission includes the use of static gates and a MOS-transistor connected as a load transistor with at least one switching MOS-transistor connected in series. The point of connection of the load transistor and the switching transistor is the output of the stage, while the control electrode(s) of the switching transistor(s) represent the input of the stage. Whenever the current path, which consists of the switching transistors, is switched, a d.c. signal flows across the entire stage. Therefore, a stage of this kind has considerable rest power losses. In the case of a multi-stage logic circuit which executes logic or arithmetic operations with resulting carry signals (for example addition of multi-bit words), the power loss becomes very considerable.

Furthermore, to safeguard against interference, a specific minimum signal range must be ensured at the output of such gate stages. This signal range is determined by the conductivity ratio of the switching transistors to the load transistor; the conductivity ratio being determined by the characteristic transistor values: namely, channel length and channel width. Therefore, gates of this kind are also referred to as ratio gates. To assure that the signal range is sufficient, this ratio of channel width to channel length must be selected high for the MOS-transistor which is connected as a load transistor. Consequently, freedom of dimensioning is limited by static ratio gates. This is particularly disadvantageous for the switching times of such gates. If the output resistance is high as a result of the above-mentioned dimensioning regulation regarding the signal range, the time constants consisting of the output resistance of a preceding stage and the capacitive input resistance of the following stage are also high, as a result of which the switching times are of a corresponding length.

In order to avoid the above-mentioned disadvantage in ratio gates, ratio-free dynamic gates have been used. In ratio-free dynamic gates, however, the advantage of low d.c. power losses is accomplished at the cost of greater circuit complexity due to the required control pulse trains.

It is known that MOS-transistors have a symmetrical switching characteristic, i.e., they can be connected by way of their controlled path between source and drain directly into a signal-conducting path such that signal transfer in both directions is possible as a function of control signals connected to the control electrode.

2. Field of the Invention

The field of art to which this invention pertains is a multi-stage logic circuit employing integrated MOS-circuit techniques to produce carry signals.

SUMMARY OF THE INVENTION

It is a principal feature of the present invention to provide an improved multi-stage logic circuit using MOS-circuit techniques and using gates for transmission of carry signals.

It is another feature of the present invention to provide a circuit as described above which reduces static power losses.

A further feature of the present invention provides d.c.-free transmission of carry signals in logic circuit arrangements where, due to the avoidance of dynamic, ratio-free gates, static switching characteristics are provided.

Another feature of the invention is to provide a logic circuit arrangement as described above where the gates which transmit the carry signals comprise transfer gates.

It is also an object of the invention to provide a circuit as described above where the transmission of carry signals is virtually free of d.c. power losses and where dimensioning freedom is also unrestricted, since, due to the freedom from static power loss, the characteristic transistor values, namely, channel length to channel width are required only to be selected in dependence upon load capacitance and switching time.

It is an object of the invention to provide a circuit designed above as a full adder.

It is another object to provide such a circuit designed as a comparator.

It is another object to provide such a circuit designed as a synchronous binary counter.

It is a further object to provide such a circuit designed as a forwards-backwards synchronous binary counter.

It is yet another object to provide such a circuit designed as a decadic counter.

DESCRIPTION OF THE PREFERRED EMBODIMENTS

This invention relates to a multi-stage logic circuit employing integrated circuitry techniques having gates to develop and transmit carry signals between stages.

Figure 1:
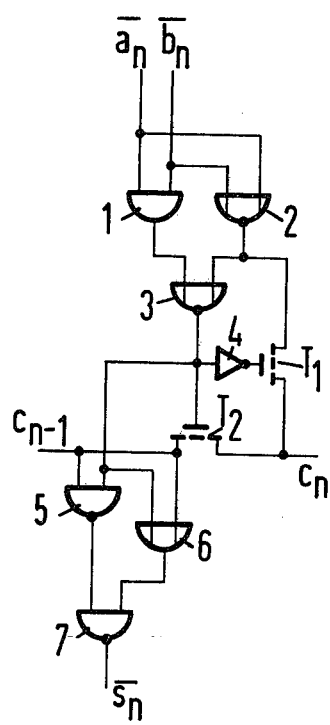
FIG. 1 illustrates a stage of a logic circuit arrangement which is designed as a full-adder in accordance with the invention.

FIG. 1 represents one stage of a full-adder for multi-digit dual numbers. The individual digits of the dual numbers which are to be added will be referred to as $a_1$ to $a_x$ and $b_1$ to $b_x$. The digits of the two dual numbers which are to be added by the stage illustrated in FIG. 1 will be referred to as the n's digits. As the two digits which are to be added must be fed in inverted form into the addition stage in the exemplary embodiment, their inputs are referenced $\bar{a}_n$ and $\bar{b}_n$. These two inputs are in parallel with the inputs of an AND-gate 1 and a NOR-gate 2. The output of the AND-gate 1, and the output of the NOR-gate 2 are each coupled to an input of a further NOR-gate 3.

An input $C_{n-1}$ receives a carry signal from the addition stage for the preceding, low-value digit. This carry signal input $C_{n-1}$ is coupled to an input of a NAND-gate 5 and an OR-gate 6. The particular other input of the NAND-gate 5 and the OR-gate 6 is coupled to the output of the NOR-gate 3. The outputs of the NAND-gate 5 and the OR-gate 6 are each coupled to an input of a NAND-gate 7, at which output the sum signal can be obtained. As this sum signal is present in inverted form at the output of the NAND-gate 7, it is referenced $\overline{S}_n$. In a special embodiment of the invention, for each addition stage of the full-adder, there is provided a carry signal transfer gate which comprises a first arm containing a transfer transistor $T_1$ and which transmits to the carry signal output, a carry signal formed during the addition in the same stage. The transfer gate also comprises a second arm containing a transfer transistor $T_2$ and which transmits to the carry signal output $C_n$, a carry signal which is formed during the addition in the preceding addition stage for the lower-value digit and which likewise produces a carry signal signal during the addition in the same stage. The transistor $T_2$ further comprises a common control input which leads via an inverter 4 to the control electrode of the transfer transistor $T_1$ and directly to the transfer transistor $T_2$. The transfer transistor $T_1$ here is connected by its controlled path between the output of the NOR-gate 2 and the carry signal output $C_n$. The transfer transistor $T_2$ is connected by its controlled path between the carry signal input $C_{n-1}$ and the carry signal output $C_n$. The output of the NOR-gate 3 forms the control input for the two transfer transistors $T_1$ and $T_2$, and the control signal for the transfer transistor $T_1$ is produced by the inverter 4.

Two characteristic situations will be considered by way of explanation of the mode of operation of the full-adder in accordance with the invention.

Firstly, it will be assumed that the dual numbers, $a_{n=1}$ and $b_{n=1}$, are to be added in the illustrated n-th stage, and that the addition in the preceding addition stage for the lower-value digit has not produced a carry, i.e. a logic "0" is present at the carry signal input $C_{n-1}$. As the numbers which are to be added are fed into the addition stage in inverted form, a logic "0" is present at the output of the AND-gate 1, whereas a logic "1" is present at the output of the NOR-gate 2. Then a logic "0" is present at the output of the NOR-gate 3, and is converted by the inverter 4 into a logic "1", so that the transfer transistor $T_1$ is rendered conductive, and the logic "1" present at the output of the NOR-gate 2 is transmitted to the carry signal output $C_n$.

As will be understood, as a result of the logic "0" at the output of the NOR-gate 3 and the logic "0" at the carry signal input $C_{n-1}$, there occurs a logic "1" at the output $\overline{S}_n$ which represents the inverted result from the sum signal in this stage.

A further characteristic situation will be assumed to be that in which the dual numbers $a_n = 1$ and $b_n = 0$ are to be added in the addition stage illustrated in FIG. 1, and in which the addition in the preceding stage for the lower-value digit has produced a carry signal, so that a logic "1" is present at the carry signal input $C_{n-1}$. The inverted, logic input signals $\overline{a}_n$ and $\overline{b}_n$ are then 0 and 1 respectively. Then a logic "0" occurs both at the output of the AND-gate 1 and at the output of the NOR-gate 2, which produces a logic "1" at the output of the NOR-gate 3. Consequently, a logic "0" is present across the transfer transistor $T_1$, and a logic "1" is present at the input of the transfer transistor $T_2$. This means that the logic "1" present at the carry signal input $C_{n-1}$ is transferred to the carry signal output $C_n$.

As all the input signals of the NAND-gate 5 and the OR-gate 6 are still equal to a logic "1", a logic "1" appears at the output $\overline{S}_n$ as an inverted sum signal.

As shown by the two examples explained above, the transfer transistor $T_1$ transfer carry signals which are formed during the addition in this stage, whereas the transfer transistor $T_2$ transfers carry signals when a carry signal has been formed in the preceding stage for the lower-value digit. Simultaneously, as a result of this carry signal from the lower-value stage, a carry signal is likewise formed in the subsequent addition.

Figure 2:
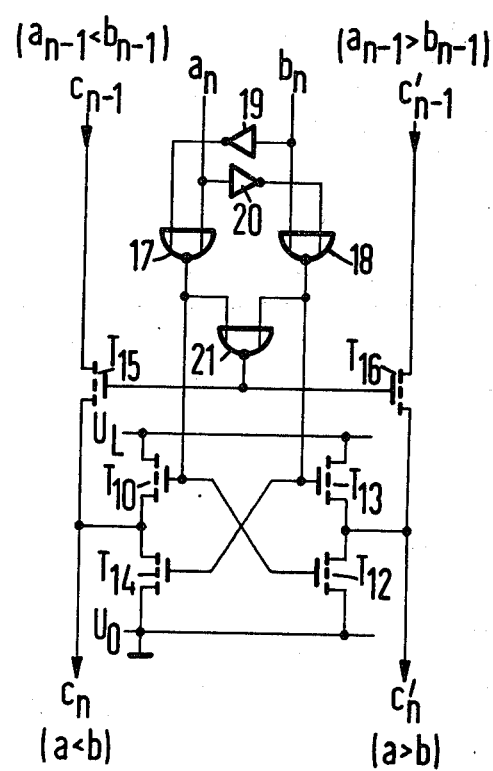
FIG. 2 illustrates a logic circuit arrangement designed as a comparator in accordance with the invention.

FIG. 2 illustrates an embodiment of a stage of a logic circuit arrangement, designed as a comparator, for comparing multi-digit dual numbers. The digits of two dual numbers, which are to be compared in this stage, will be assumed to be the n's digits. Those digits of the dual numbers which are to be compared with one another are fed into the stage at inputs referenced $a_n$ and $b_n$. In dependence upon whether $a_n$ is smaller than or greater than $b_n$, at an output $C_n$ and $C'_n$, the stage supplies an output signal which represents the carry signal for the following stage. Correspondingly, the stage represented in FIG. 2 possesses inputs $C_{n-1}$ and $C'_{n-1}$, at which the carry signals are fed from the preceding stage for the comparison of the lower-value digits of the dual numbers to be compared. The numbers $a_n$ and $b_n$ which are to be compared are each fed into an input of two NOR-gates 17 and 18. The two remaining inputs of these NOR-gates 17 and 18 are fed in the manner represented via an inverter 19 and 20 with the inverted input signal. The outputs of the NOR-gates 17 and 18 are each connected to an input of a further NOR-gate 21. Transfer transistors $T_{15}$ and $T_{16}$ are in each case arranged in the signal arm between the carry signal inputs $C_{n-1}$ and $C'_{n-1}$, and the carry signal outputs $C_n$ and $C'_n$. These two transfer transistors are operated in common from the output of the NOR-gate 21, and form a part of a transfer-gate for the carry signals.

This transfer-gate also contains a circuit having two arms in which two pairs of transfer transistors $T_{10}$, $T_{14}$ and $T_{13}$, $T_{12}$ are connected in series to a predetermined voltage $U_L$. The control electrodes of these transfer transistors are crosscoupled, and the connection points of their respective controlled paths between source and drain are connected to the carry signal outputs $C_n$ and $C'_n$.

Two characteristic conditions of the stage illustrated in FIG. 2 will be considered by way of explanation of the mode of operation of a comparator of this kind.

Firstly, it will be assumed that the comparison in a preceding stage which has not been illustrated for the lower-value digit of the dual numbers which are to be compared has resulted in identity, i.e. a logic "0" is present at each of the carry signal inputs $C_{n-1}$ and $C'_{n-1}$. It will further be assumed that in the dual numbers which are to be compared, $a_n$ is greater than $b_n$. Then a logic "1" is present at the input $a_n$, and a logic "0" is present at the input $b_n$. Then a logic "0" occurs at the output of the NOR-gate 21, so that the transfer transistors $T_{15}$ and $T_{16}$ are blocked. With the selected states of the input signals, a logic "0" is present at the output of the NOR-gate 17, and a logic "1" is present at the output of the NOR-gate 18, and the transfer transistors $T_{13}$ and $T_{14}$ are rendered conductive, whereas the transfer transistors $T_{10}$ and $T_{12}$ are blocked. The voltage UL is transmitted by $T_{13}$ to the carry signal output $C'_n$, as a result of which, $a_n$ is greater than $b_n$, which corresponds to the above condition. Simultaneously, the carry signal output $C_n$ is connected via the conductive transfer transistor $T_{14}$ to ground, which assures that a logic "0" is always present at the carry signal output $C_n$.

Irrespectively of the comparison in the preceding stage, for the lower-value digit of the dual numbers which are to be compared, only the result of the comparison in the represented stage is transferred to the following stage for a higher-value digit. If in fact, the comparison proves that the dual number, a, in the n-th stage is greater, the result of the comparison in the preceding stage for the lower-value digit is immaterial, as then the dual number, a, is in any case greater than the dual number, b.

By way of another characteristic situation it will now be assumed that the digits $a_n$ and $b_n$ are equal, and that the comparison in the preceding stage for the lower-value digit has proved that $a_{n-1}$ is greater than $b_{n-1}$, so that a logic "1" is present at the carry signal input $C'_{n-1}$. If, for example, the input values $a_n$ and $b_n$ are each equal to a logic "0", a logic "0" is present at the outputs of the NOR-gates 17 and 18, and a logic "1" is present at the output of the NOR-gate 21. Then the transfer transistors $T_{10}$ to $T_{14}$ are blocked, while the transfer transistors $T_{15}$ and $T_{16}$ are rendered conductive. Consequently, only the logic "1" present at the carry signal input $C'_{n-1}$ can be transmitted to the carry signal output $C'_n$, so that it is indicated to the following stage (for the higher-value digits) that a comparison in the preceding stages (for the lower-value digits) has resulted in non-identity. Thus, in the selected example, one of the digits $a_1$ to $a_{n-1}$ is greater than one of the digits $b_1$ to $b_{n-1}$.

Figure 3:
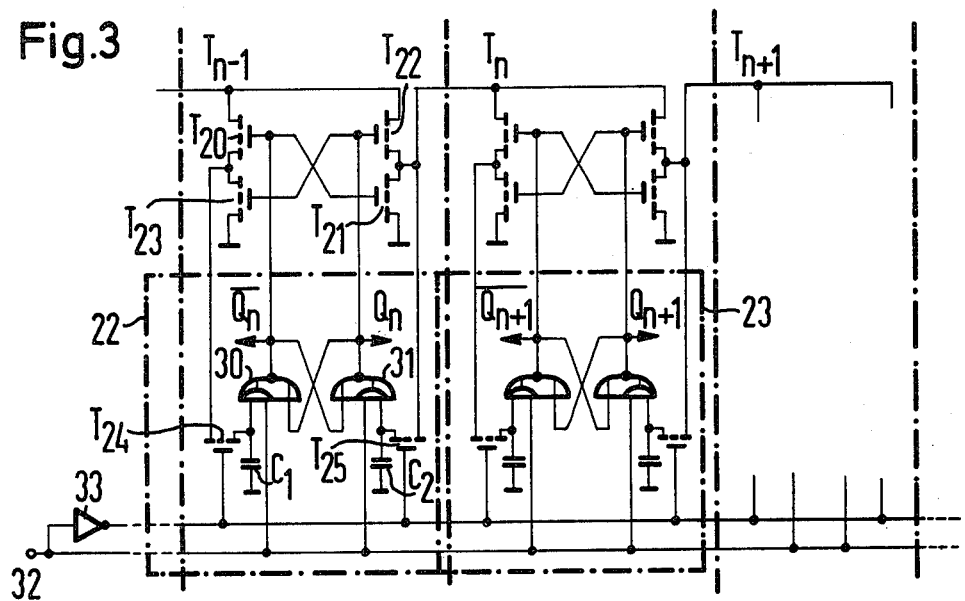
FIG. 3 illustrates a logic circuit arrangement designed as a synchronous binary counter in accordance with the invention.

FIG. 3 illustrates an embodiment of a stage of a multi-stage, logic circuit in accordance with the invention designed as a synchronous binary counter. A synchronous binary counter of this kind firstly contains, in a known manner, one bistable trigger stage 22, 23, ... in each counting stage. In each trigger stage there are provided two cross-coupled gates 30 and 31, which combine AND- and NOR-functions. These gates are fed at an input 32 with pulses which are to be counted, so that all the trigger stages of the counter are fed with the pulses which are to be counted both directly and via an inverter 33. The outputs of the gates 30 and 31 simultaneously constitute the relevant outputs $\bar{Q}_n$ and $Q_n$, $Q_{n+1}$ and $\bar{Q}_{n+1}$, ... of the counter stages. At inputs $T_{n-1}$, $T_n$, $T_{n+1}$, ..., a carry signal is fed from the relevant preceding stage. To transfer these carry signals, a transfer-gate is provided which possesses two arms, in which two pairs of transfer transistors $T_{20}$, $T_{23}$ and $T_{22}$, $T_{21}$ are connected in series at the carry signal input (for example $T_{n-1}$). The control electrodes of these transfer transistors are mutually cross-coupled, and the control electrodes of the transfer transistors $T_{20}$ and $T_{22}$, which are directly connected to the carry signal input, are connected to outputs of the bistable trigger stage (for example $\bar{Q}_n$ and $Q_n$ of the trigger stage 22). The connection points of the series-connected transfer transistors $T_{20}$, $T_{23}$ and $T_{21}$, $T_{22}$ are each connected via further transfer transistors $T_{24}$, $T_{25}$ to the input of the AND-function of the gates 30 and 31, where the gate terminals of the transfer transistors $T_{24}$, $T_{25}$ are fed with the inverted pulses which are to be counted from the input 32. Capacitances $C_1$ and $C_2$, which are connected to ground from these inputs, serve, in a known manner, as pre-storage capacitances for the output switching states to be assumed by the bistable trigger stages 22, 23, ....

The mode of operation of a synchronous binary counter of this kind will be explained on the basis of a starting counting state in which a logic "0" is present at all the outputs $Q_n$, $Q_{n+1}$, ... and a logic "1" is present at all the outputs $\bar{Q}_n$, $\bar{Q}_{n+1}$. Each trigger stage in the chain is to switch over, in accordance with the set plan, only when all its preceding, lower-value trigger stages have previously switched over. In this case a logic "1" is present at the corresponding carry signal input $T_{n-1}$.

It will be assumed that the trigger stage 22 occupies a switching stage in which a logic "0" is present at its output $Q_n$, and a logic "1" is present at its output $\bar{Q}_n$, i.e. that this stage has not yet switched over. It will further be assumed that all the preceding stages for the lower-value counting stages have already switched over. Therefore, a logic "1" is present at the carry signal input $T_{n-1}$. As the transfer transistor $T_{22}$ is still blocked as a result of a logic "0" at its control input, the carry signal at the input $T_{n-1}$ cannot yet be transferred to the following stage for the higher-value counting stage.

Not until the trigger stage 22 switches over with the succeeding input pulse to be counted (at the input 24, so that a logic "1" occurs at its output $Q_n$ and a logic "0" occurs at its output $\bar{Q}_n$, when all the lower-value trigger stage outputs $Q_1, Q_2, \ldots Q_{n-1}$ have again assumed the logic "1" switching state) does the transistor $T_{22}$ transfer a carry signal to the next stage by the outputs $Q_{n+1}$, $\bar{Q}_{n-1}$.

It can also be seen from the circuit illustrated in FIG. 3 that at the inputs of the gates 30 and 31, via the transfer transistors $T_{24}$ and $T_{25}$, the transfer transistors $T_{20}$ to $T_{23}$ each produce logic signals which are required for the switch-over function of the trigger stages which operate the latter.

Figure 4:
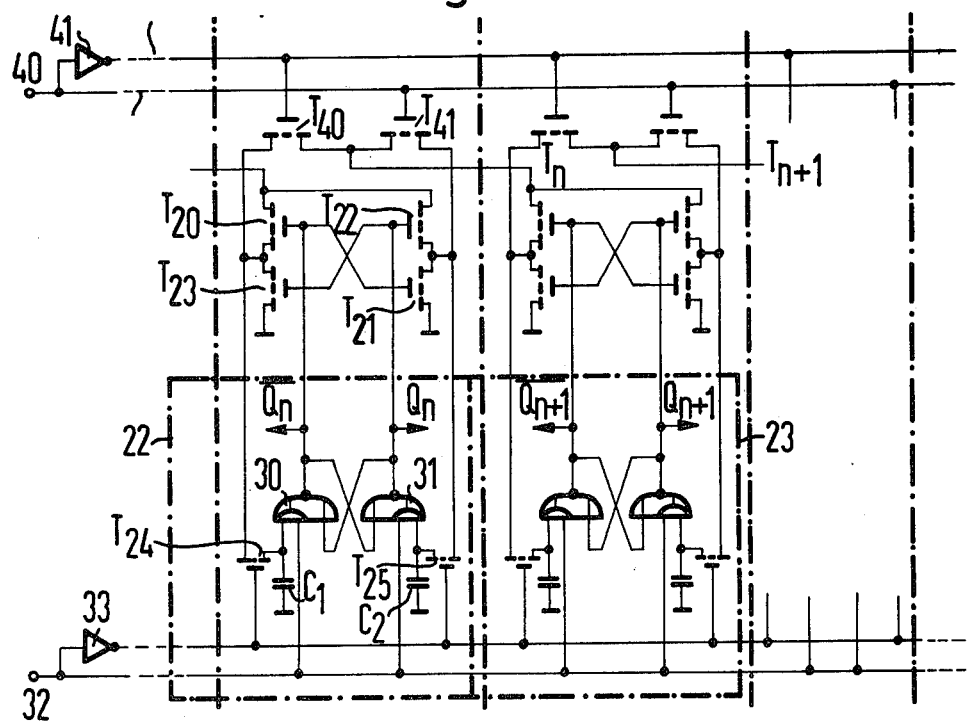
FIG. 4 illustrates a logic circuit designed as a forwards-backwards synchronous binary counter in accordance with the invention.

FIG. 4, in which identical components to those in FIG. 3 have been provided with like references, shows an embodiment of a multi-stage, logic circuit arrangement in accordance with the invention designed as a forwards-backwards synchronous binary counter.

As a supplementation to the synchronous binary counter illustrated in FIG. 3, a further arm is provided consisting of two series-connected transfer transistors $T_{40}$ and $T_{41}$ which, by their series-connected controlled paths between source and drain, are coupled to the connection points of the series-connected controlled paths between source and drain of the transfer transistors $T_{20}$, $T_{23}$ and $T_{22}$, $T_{21}$. The carry signal outputs of the counter stages are each formed by the connection points of the controlled paths of the transfer transistors $T_{40}$ and $T_{41}$, which, as in the embodiment shown in FIG. 3, are coupled to the transfer transistor $T_{20}$ and $T_{22}$. At an input 40, a control signal is fed which passes into the counter on the one hand directly, and on the other hand, is inverted via an inverter 41, facilitating forwards- and backwards-counting.

In the backwards-counting mode, the counting stage with the output $Q_n$ is to switch over when all the lower-value counting stages previously assume the logic "0" state with their outputs $Q_1, Q_2, \ldots Q_{n-1}$. In this case, all the transistors $T_{20}$ of the lower-value stages with the outputs $Q_1, \ldots Q_{n-1}$ are switched through, and all the transistors $T_{40}$ of the entire counting chain are switched through via the inverted control input 40. For the carry input $T_{n-1}$ of the stages with a $Q_n$ output, there then occurs a logic "1", which in accordance with the set plan, causes the trigger stage with the output $Q_n$ to switch over when a further counting pulse is supplied at the input 32. In the same manner, via the transistor $T_{23}$ of the counting stage having the output $Q_n$, a logic "0" is applied to the carry input $T_n$ of the stage having the output $Q_{n+1}$, which remains blocked from switching over until all the stages with the outputs $Q_1, Q_2, \ldots Q_n$ have assumed the logic "0" state at these outputs.

In order to attain the forwards-counting mode, via the input 40 and the inverter 41, the transistors $T_{41}$ are switched on, and at the same time the transistors $T_{40}$ are switched off. As can be readily seen, the counting process in the circuit represented in FIG. 4 proceeds in the same way as already explained in connection with the circuit illustrated in FIG. 3.

Figure 5:
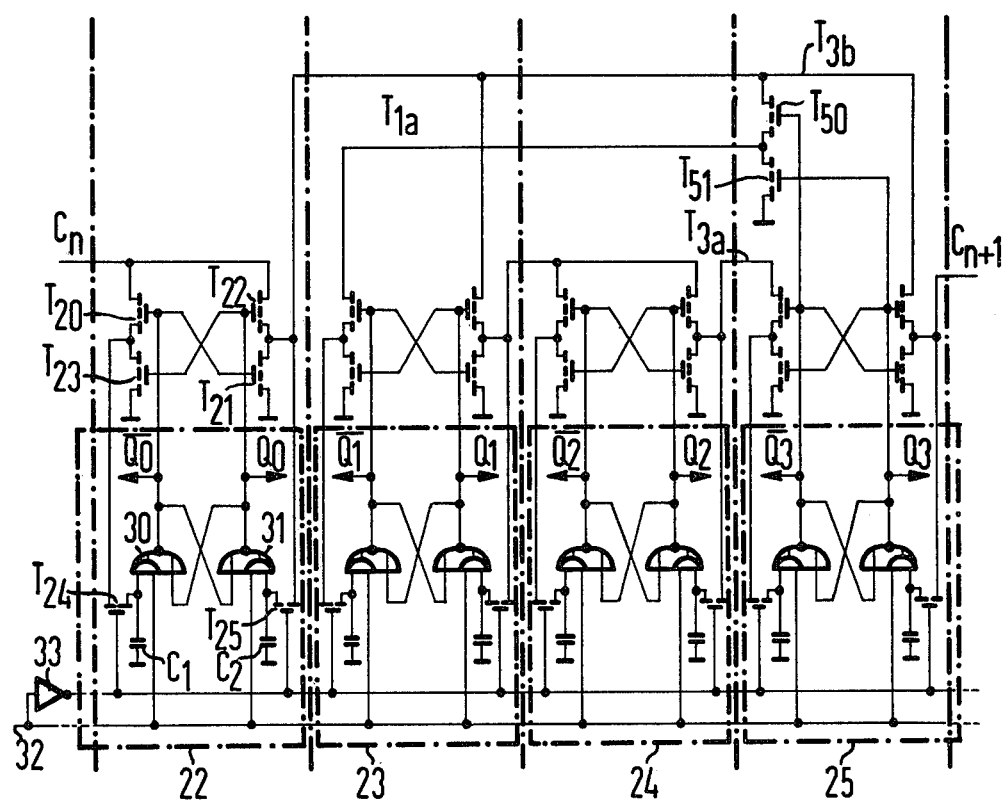
FIG. 5 illustrates a logic circuit designed as a decadic counter in accordance with the invention.

FIG. 5, in which identical components to those in FIGS. 3 and 4 have been provided with like references, shows an embodiment of a multi-stage, logic circuit arrangement in accordance with the invention which is designed as a forwards-synchronous counting decade. A counting decade of this type firstly contains, in a known manner, four trigger stages 22, 23, 24, 25 which, in accordance with the set plan are to count the counting pulses fed in at the input 32 in the 1, 2, 4, 8-BCD-code. The binary weighting of the outputs $Q_0 \ldots Q_3$ of the trigger stages 22, ... 25 here correspond to the indices selected for the outputs, i.e. the counts are passed through in accordance with the following code table:

| 22 $Q_0$ | 23 $Q_1$ | 24 $Q_2$ | 25 $Q_3$ | Count |
|---|---|---|---|---|
| 0 | 0 | 0 | 0 | 0 |
| 1 | 0 | 0 | 0 | 1 |
| 0 | 1 | 0 | 0 | 2 |
| 1 | 1 | 0 | 0 | 3 |
| 0 | 0 | 1 | 0 | 4 |
| 1 | 0 | 1 | 0 | 5 |
| 0 | 1 | 1 | 0 | 6 |
| 1 | 1 | 1 | 0 | 7 |
| 0 | 0 | 0 | 1 | 8 |
| 1 | 0 | 0 | 1 | 9 |
| 0 | 0 | 0 | 0 | 0 |
| . | | | | |
| . | | | | |
| . | | | | |

To execute the required logic operations as an extension of the synchronous binary counter illustrated in FIG. 3, the following circuit addition has been provided in the forwards-synchronous counting decade shown in FIG. 5:

The series arrangement of the controlled paths of the transfer transistors $T_{21}$ and $T_{22}$ at the output end of the transfer-gates $T_{20}$ to $T_{23}$ of the last trigger stage 25 of the n-th decade is coupled, via a signal link T3b, to the connection point of the controlled paths of the transfer transistors $T_{21}$ and $T_{22}$ at the output end of the transfer-gate of the first trigger stage 22, and to the series arrangement of the controlled paths of the transfer transistors $T_{21}$ and $T_{22}$ at the output end of the transfer-gate of the second trigger stage 23 of the decade.

Furthermore, the signal link T3b is connected via the series arrangement of the controlled paths of two transfer transistors $T_{50}$ and $T_{51}$ to reference potential.

The control input of the transfer transistor $T_{50}$ which is connected by its controlled path directly to the signal link T3b is coupled to the one output $Q_3$ of the last trigger stage 25 of the decade, whereas the control input of the transfer transistor $T_{51}$, which is connected by its controlled path in series to the controlled path of the transfer transistor $T_{50}$ (which is directly connected to the signal link T3b), is coupled to the other output $\overline{Q_3}$ of the last trigger stage 25 of the decade.

The connection point of the controlled paths of the transfer transistors $T_{50}$ and $T_{51}$, which is connected to the signal link T3b, is coupled to the series arrangement of the controlled paths of the transfer transistors $T_{20}$ and $T_{23}$ at the input end of the transfer-gate of the second trigger stage 23 of the decade.

The series arrangement of the controlled paths of the transfer transistors $T_{20}$ and $T_{23}$ at the input end of the transfer-gate of the last trigger stage 25 of the decade is coupled to the connection point of the controlled paths of the transfer-transistors $T_{21}$ and $T_{22}$ at the output end of the transfer-gate of the last but one trigger stage 24 of the decade.

Finally, the connection poing of the controlled paths of the transfer transistors $T_{21}$ and $T_{22}$ at the output end of the transfer-gate of the last stage 25 forms the carry signal output $C_{n-1}$ of the decade.

In order to facilitate a series connection of an arbitrary number of counting decades of identical construction, whose trigger stages will all be assumed to be operated by the same counting signal at the input 32, the carry output $C_{n+1}$ of the general counting decade, n, illustrated in FIG. 5 must, during the count "9", emit a signal which, when the counting decade, n, is stepped into the count "0" causes the general counting decade, n+1, to be advanced.

As can be seen from the code table, the switching states of the outputs $Q_0$ and $Q_2$ of the trigger stages 22 and 24 correspond to the switching states in a four-stage binary counter. The transistors $T_{20}, \ldots T_{23}$ of the trigger stages 22 and 24 in FIG. 5 are therefore connected into the signal flow in the same manner as illustrated in the case of the transistors $T_{20}, \ldots T_{23}$ of the exemplary embodiment for a synchronous binary counter shown in FIG. 3. In contrast to the binary counter, in the case of the decadic counter, the output $Q_1$ of the trigger stage 23 must be prevented from switching over to a logic "1" in the count 0, and it must be provided that, in the count 0, the output $Q_3$ of the trigger stage 25 switches over to a logic "0".

In accordance with the invention, in the circuit illustrated in FIG. 5, this is achieved in that the upper terminals of the transistors $T_{20}$ and $T_{22}$ of the transfer-gates assigned to the trigger stages 23 and 25 are operated with different signals for the setting and resetting of these trigger stages.

In the exemplary embodiment illustrated in FIG. 5, the signals for the setting and resetting of the trigger stage 23 are referenced T1a and T3b, whereas the signals for the setting and resetting of the trigger stage 25 are referenced T3a and T3b. The signals T3a and T3b represent the carry outputs of the transfer-gates which, in accordance with FIG. 3, are assigned to the trigger stages 24 and 22 and consist of the transistors $T_{21}$ and $T_{22}$. In the exemplary embodiment shown in FIG. 5, a further transfer-gate, consisting of the transistors $T_{50}$ and $T_{51}$, has been introduced. The transistors $T_{50}$ and $T_{51}$ are connected with their controlled paths in series between the signal T3b and ground, and their gate terminals are driven from the outputs $Q_3$, $\overline{Q_3}$ of the trigger stage 25. The setting signal $T_1$ which serves to set the trigger stage 23 is derived at the connection point between the controlled paths $T_{50}$ and $T_{51}$. As for the mode of operation of the exemplary embodiment shown in FIG. 5, it will be seen that from the count "0" to the count "7", the switching sequence of the trigger stages 22 to 24 corresponds to the binary code shown in the preceding code table. As at the count 7, the setting signal T3a becomes a logic "1". With the next counting pulse, the trigger stage 25 switches over, so that the desired count 8 is established. Consequently, the transistor $T_{50}$ is switched "off" and the transistor $T_{51}$ is switched "on", so that the setting signal T1 assumes the logic "0" level, and the trigger stage 23 is initially blocked from further switch-over.

A further counting pulse causes the trigger stage 22 to switch over and thus brings about a transition into the count 9. Here it will be seen that the trigger stages 22 to 25 are switched over with counting pulses arriving at the input 32 only when a logic "1" is present at the input $C_n$, signalling a carry from the preceding counting decade. Therefore a carry to the next counting decade via the output $C_{n+1}$ occurs only when the carry $C_n$ from the preceding counting decade and the trigger stage outputs $Q_0$ and $Q_3$ of the decade in question have assumed the logic "1" state. Due to the fact that the signal T3b has assumed the logic "1" stage and at the same time a logic "1" is present at the output $Q_3$ of the trigger stage 25, a counting pulse arriving at the input 32 in the count 9 causes the trigger stage 25 of the counting decade in question to switch over and causes the trigger stages 22 of the following counting decades to switch over. As a result, the count 0 occurs in the counting decade in question, and a count increased by 1 occurs in the following counting decade.

It will be understood that various modifications of this invention can be achieved without departing from the scope thereof as specified in the following claims.

We claim:

1. In a multi-stage logic circuit formed as an integrated MOS circuit,
   an addition stage for each digit of multi-digit numbers to be added,
   each one of said addition stages except the first one having an input for receiving a carry signal from a preceeding addition stage of a previous lower-value digit and each of said addition stages except the last one having a carry signal output which is coupled to the carry signal input of the following stage for the next higher value digit,
   said addition stages having first and second adding means, said first adding means including inputs receiving said digits of said numbers to be added, said first adding means having a first output providing a first logic value representing the sum of said digits of said numbers to be added, and a second output providing a carry signal, and
   said second adding means including inputs for receiving the carry value of the preceeding addition stage and and inputs for receiving the value representing the sum of said digits of said numbers to be added and an output providing a logic value representing the sum for the addition stage;
   each of said addition stages having a transfer gate,
   said transfer gates each having a first arm coupled between said second output of said first adding means and said carry signal output and including a single first transfer transistor, a second arm coupled between said carry signal input and said carry signal output and including a second single transfer transistor, and an inverter having an input coupled to said first output of said first adding means and an output coupled to a control electrode of said first single transfer transistor, a control electrode of said second single transfer transistor coupled to said first output of said first adding means, whereby a carry signal generated in said first adding means is transferred by said first single transfer transistor to said carry signal output and a carry signal from said carry signal input is transferred by said second single transfer transistor to said carry signal output.

2. A multi-stage logic circuit comprising a comparator stage for each digit of numbers to be compared, each comparator stage except the first one having inputs for receiving two possible carry signals formed during the comparison of a preceding lower-value digit and each comparator stage except the last one having outputs for two possible carry signals formed during the comparison in said stage for being coupled to carry signal inputs of a following comparator stage, each comparator stage having a transfer-gate, said transfer-gate including a pair of arms each of which contains a transfer transistor coupled between one of said inputs and an associated one of said outputs, a common control terminal, said transfer transistors being coupled to said common control terminal, a predetermined voltage source, a further circuit having two arms each of which contains two transfer transistors connected in series to said predetermined voltage source, the control electrodes of said last mentioned transfer transistors being mutually cross-coupled, the connection point of the controlled paths between each one of a pair of series coupled transfer transistors being connected to a respective one of said carry signal outputs, input means for two digits to be compared, and logic means comparing the signals at said input means and coupling a resulting signal to said common control terminal.

* * * * *